(12) United States Patent
Summers et al.

(10) Patent No.: US 7,248,479 B2
(45) Date of Patent: Jul. 24, 2007

(54) THERMAL MANAGEMENT FOR HOT-SWAPPABLE MODULE

(75) Inventors: Mark D. Summers, Phoenix, AZ (US); Lawson Guthrie, Portland, OR (US); William Handley, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 283 days.

(21) Appl. No.: 11/092,358

(22) Filed: Mar. 29, 2005

(65) Prior Publication Data

US 2006/0221577 A1    Oct. 5, 2006

(51) Int. Cl.
*H05K 7/20* (2006.01)
(52) U.S. Cl. .................. 361/721; 361/704; 361/719; 174/16.1; 165/80.2; 165/80.3
(58) Field of Classification Search ............ None
See application file for complete search history.

(56) References Cited

U.S. PATENT DOCUMENTS

| | | | | |
|---|---|---|---|---|
| 5,077,638 A | * | 12/1991 | Andersson et al. | ......... 361/710 |
| 5,973,923 A | * | 10/1999 | Jitaru | ......... 361/704 |
| 6,002,587 A | * | 12/1999 | Shusa et al. | ......... 361/704 |
| 6,002,588 A | * | 12/1999 | Vos et al. | ......... 361/708 |
| 6,094,349 A | * | 7/2000 | Fassel et al. | ......... 361/704 |
| 6,674,643 B2 | * | 1/2004 | Centola et al. | ......... 361/720 |
| 7,057,895 B2 | * | 6/2006 | Mejia et al. | ......... 361/700 |
| 7,074,051 B2 | * | 7/2006 | Williams et al. | ......... 439/74 |

OTHER PUBLICATIONS

Advanced TCA, PICMG 3.0 Short Form Specification, PCI Industrial Computers Manufacturers Group (PICMG), (Jan. 2003), 33 pages.
AMC PICMG AMC.0, Advanced Mezzanine Card Short Form Specification, Version D0.9a, (Jun. 15, 2004), 57 pages.

* cited by examiner

*Primary Examiner*—Boris Chérvinsky
(74) *Attorney, Agent, or Firm*—Grossman, Tucker, Perreault & Pfleger, PLLC

(57) ABSTRACT

A method according to one embodiment may include providing a heat generating component disposed on a first side of a first circuit board, and transferring heat from the heat generating component through the first circuit board to a second side of the first circuit board. The method according to this embodiment may further include slidingly thermally coupling the second side of the first circuit board to a thermal solution disposed on a second circuit board. Of course, many alternatives, variations, and modifications are possible without departing from this embodiment.

20 Claims, 6 Drawing Sheets

THERMAL MANAGEMENT FOR HOT-SWAPPABLE MODULE

FIELD

The present disclosure relates to thermal management systems, apparatus, and methods for hot-swappable modules.

BACKGROUND

The functionality of computer blades, such as advanced telecommunications computing architecture (ATCA or Advanced TCA) blades, may be increased through the addition of modules which may be electrically and mechanically coupled to the computer blade. Modules which may be used to expand the functionality of the Advanced TCA blades may include various cards, such as mezzanine cards. The cards may include components such as processors, communications interface, mass storage, etc. One particular variety of mezzanine cards that may be used to expand the functionality of computer blades is advanced mezzanine card (AdvancedMC) modules. In addition to providing components for expanding the functionality of a computer blade, AdvancedMC modules may offer the further benefit of being hot-swappable, allowing the modules to be installed, remove, exchanged, etc., without powering down or removing the computer blade from service. In part, the hot-swappability of AdvancedMC modules utilizes an edge connector allowing sliding engagement between the module and the computer blade.

While modules may be useful for expanding the functionality of a computer blade, they may also create challenges for thermal management. Many components which may be included on a module, for example integrated circuits such as processors, may generate heat which must be dissipated. This challenge is especially prevalent in mezzanine cards that are oriented parallel to the computer blade. Heat generating components extending from the module toward the computer blade may restrict the airflow in between the module and the computer blade. The restricted airflow between the module and the computer blade may decrease the convective cooling capacity. Furthermore, limitations on the spacing between the module and the computer blade may restrict the options for thermal solutions, such as heat spreaders and heatsinks, in connection with heat generating components on the module. Also, in the case of hot-swappable modules, such as advanced mezzanine cards, the hot-swappability of the module may prevent hard mounting of the module to a thermal solution associated with the computer blade.

Difficulties dissipating heat from modules may be compounded for a computer blade including more than one module. Airflow moving over the modules may be progressively heated as it passes over the modules such that the temperature of the airflow may be increased, resulting in a higher downstream temperature. The higher downstream temperature may result in less efficient cooling of downstream modules or components as compared to upstream modules. Therefore, even aside from restriction on airflow, the temperature gradient of the airflow may limit the ability to adequately cool downstream modules. This may limit the overall power which may be dissipated by the modules as a group and/or may restrict the placement of modules on the computer blade, requiring the highest heat generating modules to be placed in an upstream position.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1:
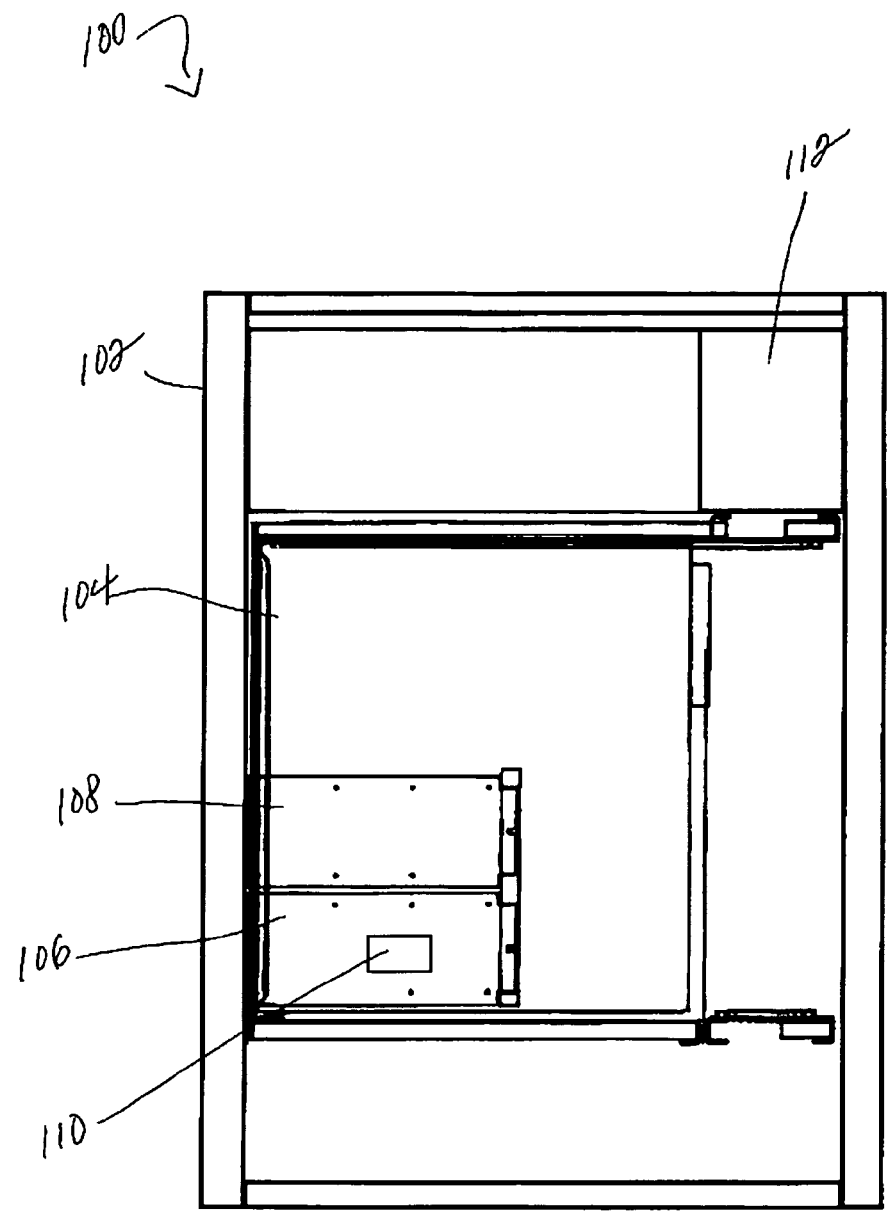
FIG. 1 schematically illustrates a system that may employ a thermal management system consistent with the present disclosure.

Referring first to FIG. 1, an embodiment of a computer system 100 is generally shown. The computer system 100 may generally include a chassis 102, and one or more circuit boards 104 at least partially disposed within the chassis 102. The circuit board 104 may be coupled to one or more smaller circuit boards, for example modules or cards 106, 108. The cards 106, 108 may include various components and/or circuitry which may expand and/or modify the functionality of the circuit board 104. Among the various components and/or circuitry disposed on one or more of the cards 106, 108 may be one or more heat generating components 110. Heat generating components 110 disposed on a card 106 may include, for example, various integrated circuits such as a processor. The computer system 100 may additionally include one or more fans 112, which may facilitate cooling of the circuit boards 104, cards 106, 108, etc.

In an embodiment consistent with the present disclosure, the computer system may be an advanced telecommunications computing architecture (Advanced TCA or ATCA) system, complying with, or compatible with, PCI Industrial Computer Manufacturers Group (PICMG), rev. 3.0, Advanced Telecommunications Computing Architecture (ATCA), published Dec. 30, 2002 (the "ATCA Specification"). According to such an embodiment, a circuit board at least partially disposed within the chassis may be an ATCA blade complying with and/or compatible with the ATCA Specification. Various other embodiments consistent with the present disclosure may include a computer system complying with and/or compatible with technical specifications other than and/or in addition to the ATCA Specification. The scope of the present disclosure should not, therefore, be construed as being limited to any particular computer system or form factor.

Additionally, in an embodiment consistent with the present disclosure, the modules or cards may be advanced mezzanine card modules, complying with and/or compatible with PCI Industrial Computer Manufacturers Group (PICMG), Advanced Mezzanine Card (AdvancedMC) Base Specification, PICMG AMC.0, published Jan. 3, 2005 (the "AdvancedMC Specification"). In other embodiments herein the module or cards may comply with and/or be compatible with various technical specifications in addition to, or in the alternative to, the AdvancedMC Specification. For example the modules or cards may be PC cards, common mezzanine cards, etc. As with the circuit board, the scope of the present disclosure should not be construed as being limited to any particular module or card form factor.

Figure 2:
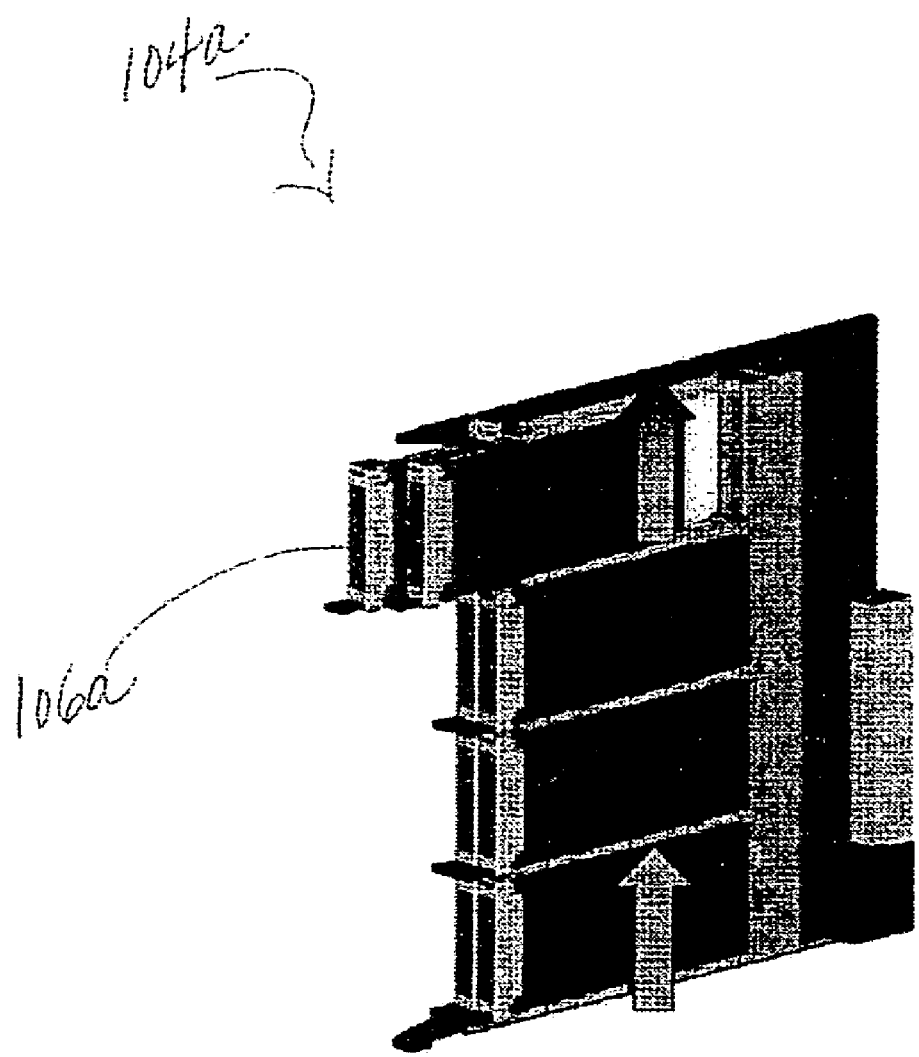
FIG. 2 is a perspective view of an embodiment of a carrier card including a plurality of removable modules.

Turning to FIG. 2, the airflow relative to a circuit board 104a coupled to a plurality of cards 106a is shown. Consistent with the illustration, the cards 106a may be, at least in part, convectively cooled by the airflow. However, the airflow may be progressively heated as the air flows across the circuit board 104a and cards 106a. That is, as the airflow moves across the circuit board 104a and/or the cards 106a the air may be heated by heat generating components disposed on and/or associated with the circuit board 104a and/or the cards 106a. Accordingly, the airflow may have a higher temperate at a downstream location relative to the temperature of the airflow at an upstream location. The increased temperature of the airflow at a downstream location may reduce the capacity of the airflow to dissipate heat from a heat generating component at and/or adjacent to a downstream location.

Figure 3:
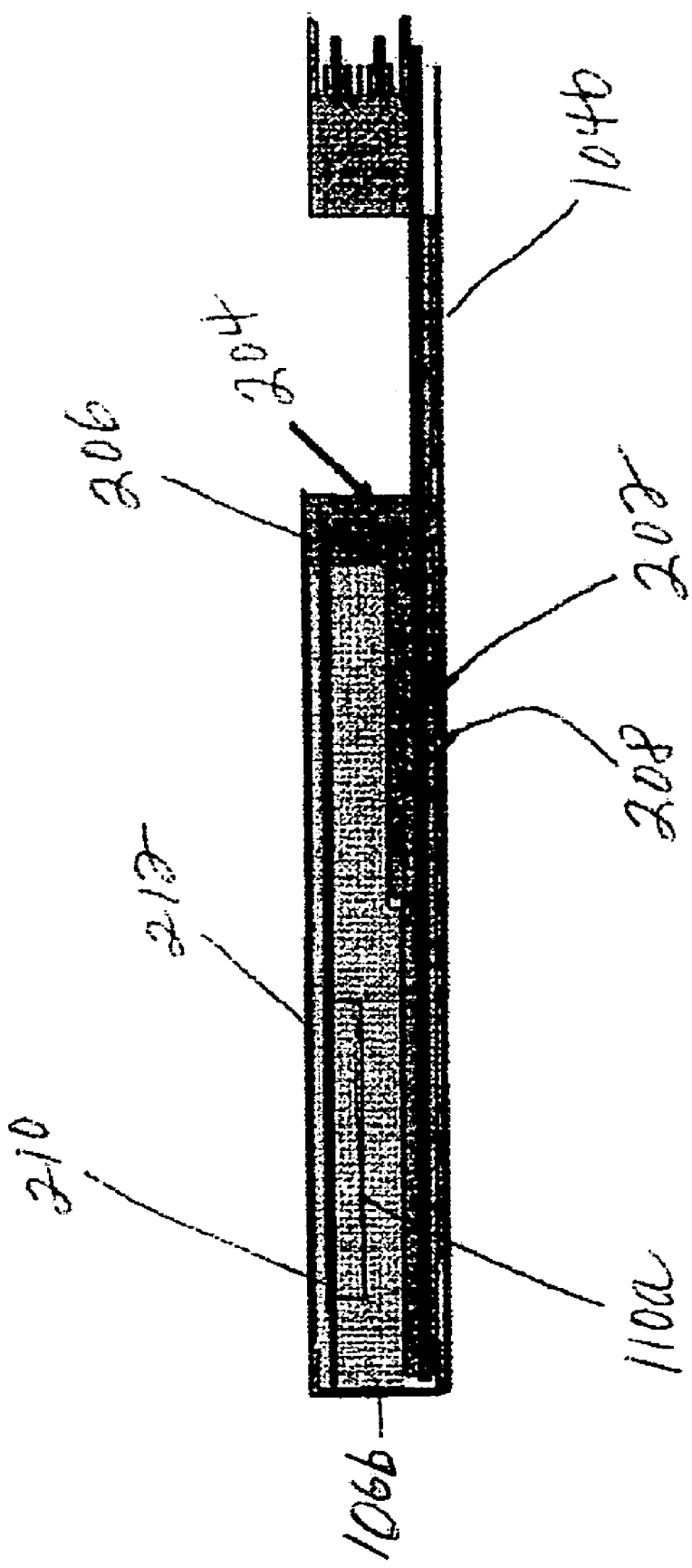
FIG. 3 is a side view of an embodiment of a carrier card including a removable module.

FIG. 3 shows an embodiment of a circuit board 104b in a side elevation. As shown, a card 106b may be coupled to the circuit board 104b. The circuit board 104b may include a board 202 having a card connector 204 thereon. The card 106b may include an edge connector 206 capable of being slidingly coupled to the card connector 204. In such a configuration, the card 106b may generally be considered to be a sliding module. In an embodiment consistent with the present disclosure, a card 106b configured as a sliding module may be capable of hot-swappable connection to the circuit board 104b. In addition to the card connector 204, the circuit board 104b may include various components 208 disposed on the board 202.

As shown in the illustrated embodiment, the card 106b may be configured as a mezzanine card. The card 106b may extend from the card connector 204 generally parallel to the circuit board 104b. The card 106b may include a card circuit board 210. At least one heat generating component 110a may be disposed on the card circuit board 210 facing toward the board 202 of the circuit board 104b. The proximity of the heat generating component 110a relative to the board 202 of the printed circuit board 104 and/or to components 208 disposed on the printed circuit board 104b may restrict airflow adjacent to the heat generating component 110a, and may impede the dissipation of heat produced by the heat generating component 110a. As also shown, the circuit board 104b may include a top component cover 212, which may at least partially overlie the card 106b. As shown, in some configurations, the top component cover 212 may be coupled to the card connector 204.

Figure 4:
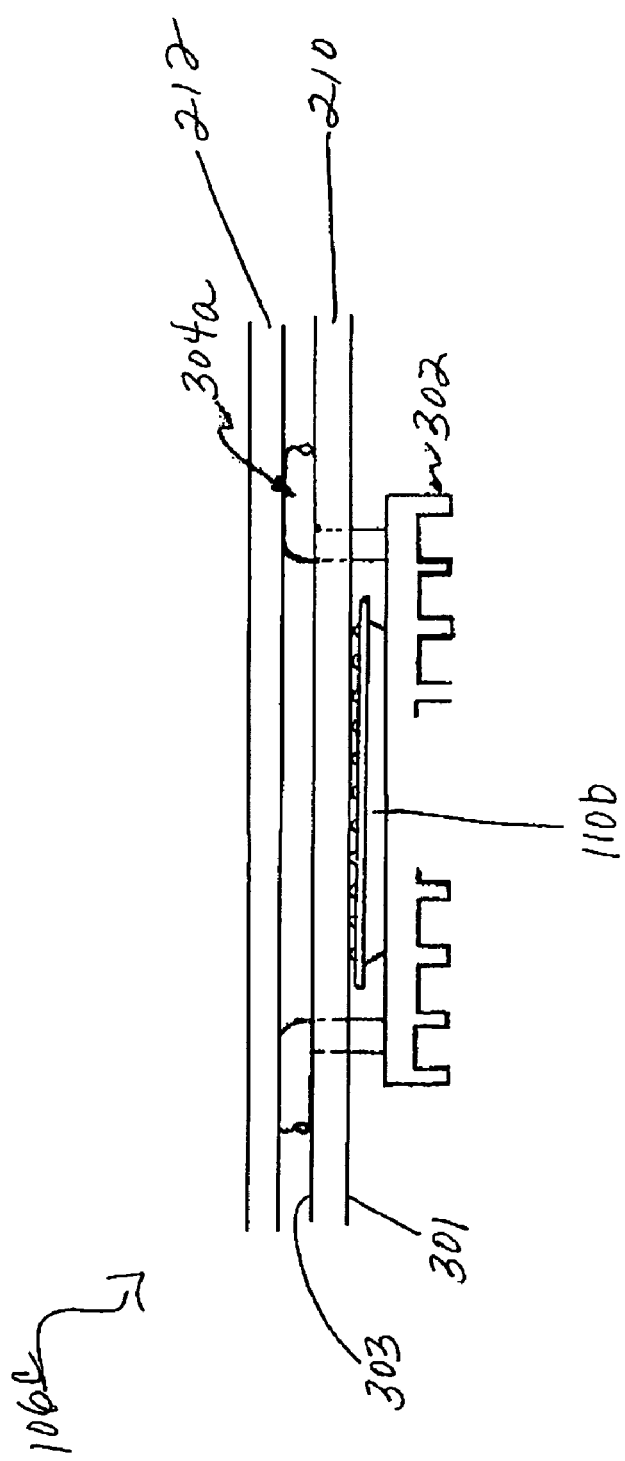
FIG. 4 schematically illustrates an embodiment of a front-to-back heat transfer arrangement consistent with the present disclosure.

A detailed view of a portion of an embodiment of a card 106c is shown in FIG. 4. A heat generating component 110b may be disposed on a component B1 side 301 of the board 210 of the card 106c. The heat generating component 110b may include a thermal solution 302. As used in any embodiment herein a thermal solution is any element, structure or assembly capable of dissipating heating and/or removing heat including, but not limited to, heat sinks, heat spreaders, heat pipes, heat exchangers, etc. A through-board heat transfer device 304a may be thermally coupled to the heat generating component 110b disposed on the board 210. In one embodiment, the heat transfer device 304a may be indirectly thermally coupled to the heat generating component 110b via the B1 side 301 thermal solution 302. According to another embodiment, the through-board heat transfer device may be directly thermally coupled to the heat generating component. In still further embodiments, various other components, structures, etc. may be coupled between the heat generating component and the through-board heat transfer device.

According to any embodiment herein, the through-board heat transfer device may be thermally coupled to the thermal solution and/or to the heat generating component according to a variety of mechanisms. For example, the through-board heat transfer device may be thermally coupled to the thermal solution and/or to the heat generating component by intimate physical contact and/or via a thermal interface material. For example, the through-board heat transfer device may be maintained in direct physical contact with the thermal solution and/or with the heat generating component. In another embodiment, the through-board heat transfer device may be soldered or welded to the thermal solution and/or to the heat generating component. In yet another embodiment, the through-board heat transfer device may be coupled to the thermal solution and/or to the heat generating component using a thermally conductive adhesive, such as a metal filled adhesive. Various other mechanisms for thermally coupling the through-board heat transfer device and the thermal solution and/or the heat generating component.

The through-board heat transfer device consistent with the present disclosure may provide a thermally conductive pathway extending from the component B1 side 301 of the board 210 to the component B2 side 303 of the board 210. The through-board heat transfer device may, therefore, transfer heat from the side of the card facing a carrier board, to the side of the card facing outwardly, away from the carrier board. That is, the through-board heat transfer device may pull heat from the component B1 side 301 of the board 210 and move it to the component B2 side 303 of the board 210. Accordingly, when the through-board heat transfer device 304a is thermally coupled to a heat generating component 110b, thermal solution 302, etc. on the B1 side 301 of the board 210 of the card 106c, the through-board heat transfer device 304a may transfer heat from the heat generating component 110b to the component B2 side of the board 210.

The through-board heat transfer device may be thermally coupled to a B2 side component thermal solution associated with, and/or adjacent to, the card. As shown, the through-board heat transfer device 304a may be coupled to a carrier thermal solution, for example, the component cover 212 associated with the card 106c and/or associated with the card carrier, i.e., the circuit board (not shown). The component cover 212 may be a metallic member or plate. As such, the component cover 212 may conduct heat away from the through-board heat transfer device 304a. In the foregoing manner, the component cover 212, which may be thermally coupled to the through-board heat transfer device, may act as a heat spreader and/or may dissipate heat transferred to the component B2 side 303 of the board 210 of the card 106c by the through-board heat transfer device 304a. Consistent with this aspect of the disclosure, component cover 212 may operate, at least in part, as part of a thermal solution for the heat generating component 110b disposed on the component B1 side of the card 106c. In other embodiments, the through-board heat transfer device may be thermally coupled to heat spreading and/or heat transfer devices other than, or in addition to, the component cover. For example, the through-board heat transfer device may be thermally coupled to a heat spreader, heatsink, etc. disposed on and/or associated with the card and/or the card carrier.

As mentioned the through-board heat transfer device may provide a thermally conductive pathway between the two sides of the card. The through-board heat transfer device may include a thermally conductive media, e.g., a thermally conductive member, extending through the board, e.g., through a hole in the board. The thermally conductive member of the through-board heat transfer device may include a metallic member, such as a copper or aluminum wire, rod, etc. Various other conductive materials, metallic, non-metallic, and/or composite, may also suitably be employed. Additionally, configurations other that a wire or a rod may also suitably be employed consistent with the present disclosure. For example, the though-board heat transfer device may include a copper strip having a rectangular cross-sectional geometry. The rectangular copper strip may extend between B1 and B2 sides of the board through a slot in the board. In a further embodiment, the through-board heat transfer device may include a heat pipe or other heat transfer medium.

In an embodiment, the capacity of the through-board heat transfer device to move heat from the B1 side of the board to the B2 side of the board may be related, at least in part, to the cross-sectional area of heat transfer media passing through the board. The illustrated embodiment depicts two through-board heat transfer devices, one associated with either side of the B1 side thermal solution. The size, number and location of through-board heat transfer devices may be selected based upon the layout of the board 210 and the thermal requirements of the system. For example, an application having a heat generating component that may dissipate a large quantity of heat and/or having minimal capacity to dissipate heat on the component B1 side of the board, may include one or more though-board heat transfer devices having a relatively lard cross-sectional area. That is, such an embodiment may include a large number of through-board heat transfer devices and/or may include through-board heat transfer devices having a larger cross-sectional area passing through the board. In view of the foregoing, the number, size, and/or placement of the through-board heat transfer device(s) should not be construed as limiting the scope of the present disclosure.

Figure 6:
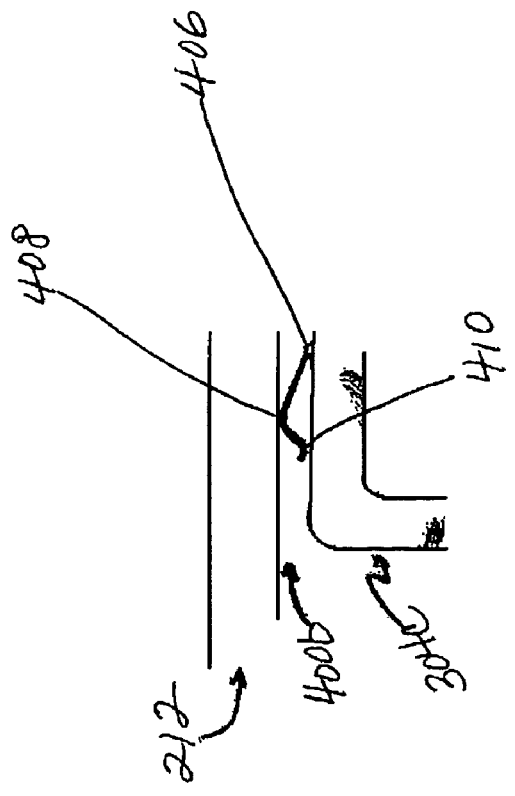
FIG. 6 schematically illustrates another embodiment of a thermal interface device consistent with the present disclosure.
Figure 5:
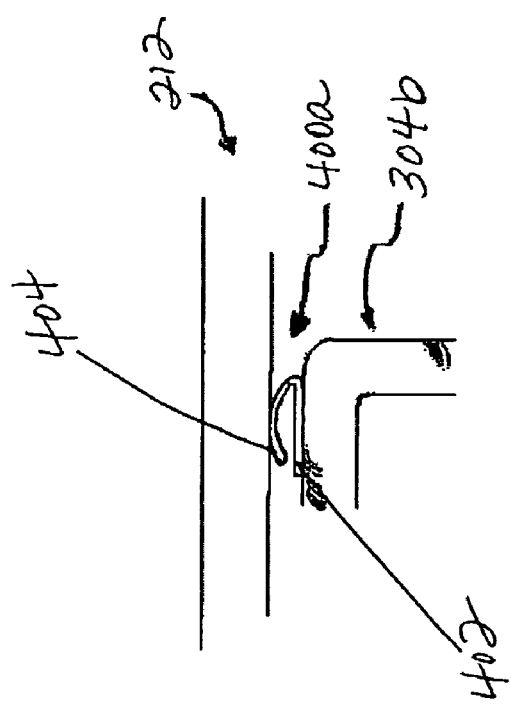
FIG. 5 schematically illustrates an embodiment of a thermal interface device consistent with the present disclosure.

According to one aspect, the present disclosure may provide a thermal interface device that may provide sliding thermal coupling between the through-board heat transfer device and a thermal solution, such as a heat spreader, heatsink, etc. associated with the carrier or circuit board. In one embodiment, slidably coupling the card to the carrier may also thermally couple the through-board heat transfer device with a carrier thermal solution, e.g., a component cover disposed adjacent to the card. In a similar manner, the thermal coupling between the through-board heat transfer device and the carrier thermal solution may be disengage simply by removing the card from the carrier. Referring to FIGS. 5 and 6 embodiments of sliding thermal interface devices 400a, 400b are shown. In each illustrated embodiment the thermal interface devices 400a, 400b may provide positive thermal coupling between the through-board heat transfer device and the carrier thermal solution by installation of the card onto the carrier. Accordingly, a thermal interface device herein may be formed from a thermally conductive material, for example, a metallic material such as aluminum, copper, etc.

Turning to FIG. 5, an enlarged view of an embodiment of a through-board heat transfer device 304b is shown thermally couple to a carrier thermal solution, in the form of a component cover 212. A thermal interface device 400a may be disposed between the through-board heat transfer device 304b and the component cover 212. The thermal interface device 400a may be thermally coupled to the through-board heat transfer device 304b and may provide sliding thermal coupling between the through-board heat transfer device 304b and the component cover 212. According to various other embodiments, the thermal interface device may thermally couple the through-board heat transfer device to a carrier thermal solution associated with the carrier other than a component cover.

As shown, the thermal interface device 400a may include a first portion 402 in contact with, and extending along at least a portion of the through-board heat transfer device 304b. As such, the thermal interface device 400a may be thermally coupled to the through-board heat transfer device 304b via the first portion 402 of the thermal interface device 400a. A second portion 404 of the thermal interface device 400a may be capable of sliding contact with the component cover 212. As shown, the second portion 404 of the thermal interface device 400a may have an arcuate geometry, which may facilitate sliding contact between the thermal interface device 400a and the component cover 212. In the foregoing manner, the thermally conductive thermal interface device 400a may thermally couple the through-board heat transfer device 304b and the component cover 212.

According to one aspect, contact between the thermal interface device 400a and the carrier thermal solution, e.g. component cover 212, may resiliently deform the thermal interface device 400a toward the through-board heat transfer device 304b. The resilient deformation of the thermal interface device 400a may ensure positive contact between the thermal interface device 400a and the component cover 212. In an embodiment, in an un-deformed configuration the second portion 404 of the thermal interface device 400a may extend outwardly from the through-board heat transfer device 304b a distance greater than the separation between the through-board heat transfer device 304b and the component cover 212. Accordingly, the thermal interface device 400b may provide sliding thermal coupling and accommodate manufacturing, tolerances, etc., effecting the separation between the through-board heat transfer device and component cover 212.

Turning to FIG. 6, another embodiment of a thermal interface device 400b is shown. A first end 406 of the thermal interface device 400b may be thermally and/or mechanically coupled to the through-board heat transfer device 304c. The thermal interface device 400b may extend away from the through-board heat transfer device 304c at an angle. A second portion 408 of the thermal interface device 408 may include an arcuate geometry having a convex profile facing away from the through-board heat transfer device 304c. The arcuate second portion 408 of the thermal interface device 400b may be capable of contacting and/or being thermally coupled to a carrier thermal solution, e.g., the component cover 212. The convex profile of second portion 408 of the thermal interface device 400b may facilitate sliding thermal coupling between the thermal interface device 400b and the component cover 212, and therein facilitate sliding thermal coupling between the through-board heat transfer device 304c and the component cover 212 via the thermal interface device 400b.

Similar to the previously described embodiment, the thermal interface device 400b may be resiliently deformed toward the through-board heat transfer device 304c when the thermal interface device 400b is engaged with and/or coupled to the carrier thermal solution. Resilient deformation of the thermal interface device 400b may facilitate thermal coupling between the thermal interface device 400b and the carrier thermal solution, such as the carrier cover 212. In one embodiment, when the thermal interface device 400b is resiliently deformed when coupled to the carrier thermal solution, a portion of the thermal interface device adjacent to a second end 410 may contact and/or be thermally coupled to the through-board heat transfer device 304c. In one such embodiment, the second end 410 of the thermal interface device 400b may include an arcuate configuration presenting a convex profile facing the through-board heat transfer device. According to such an embodiment, both ends of the thermal interface device may be thermally coupled to the through-board heat transfer device. Such an embodiment may allow conduction of heat from the through-board heat transfer device to the carrier thermal solution via both ends of the thermal interface device.

In any embodiment herein, a thermal interface device may be mechanically and/or thermally coupled to the through-board heat transfer device by any suitable arrangement and/or using any suitable techniques. For example the thermal interface device may be welded or soldered to the through-board heat transfer device. According to other embodiments, the thermal interface device may be mechanically and/or thermally coupled to the through-board heat transfer device by swaging or using an adhesive, such as a thermally conductive adhesive. Various other coupling means and/or techniques may also be employed herein.

A thermal interface device herein may be provided having various cross-sectional geometries. For example a thermal interface device may be provided as a strip having a generally rectangular cross-sectional shape. Suitable configurations may include narrow and/or wide strips. Other embodiments may be provided having a circular, oval, square, etc. cross-sectional shape. One or more thermal interface devices may be employed in connection with each through-board heat transfer device. For example, a through-board heat transfer device may use a single thermal interface device to transfer heat to a carrier thermal solution and/or a plurality of thermal interface devices may be employed to transfer heat from the through-board heat transfer device to the carrier thermal solution.

Additionally, as mentioned above, a thermal interface device may be formed from any suitable thermally conductive material. For example, a metallic material, such as copper, aluminum, etc., may advantageously be employed herein. In addition being thermally conductive, the metallic material may be provided having sufficient resiliency to allow the thermal interface device to resiliently deform when it is engaged with and/or coupled to a carrier thermal solution. Various other materials, including metallic alloys, non-metallic materials, and composite materials, etc., may be employed for proving thermal interface devices herein.

Figure 7:
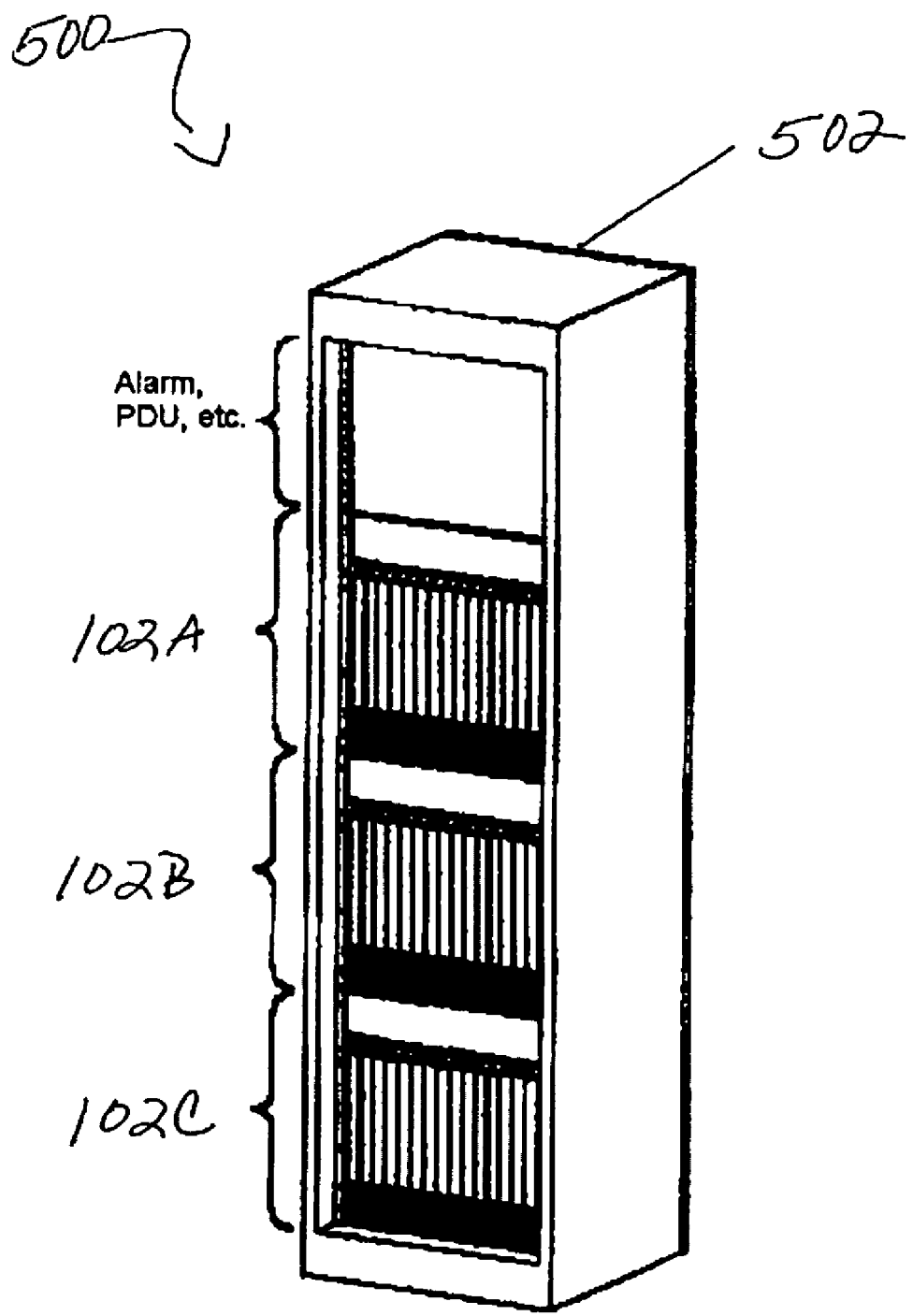
FIG. 7 depicts and embodiment of a frame including a plurality of chassis which may employ a thermal management arrangement consistent with the present disclosure.

Turning next to FIG. 7, a system 500 consistent with the present disclosure is illustrated. As depicted, the system 500 may include a frame 502. The frame 502 may accommodate and electrically couple a plurality of chassis 102A, 102B, and 102C. One or more of the chassis 102A, 102B, 102C may include at least one circuit board which may be coupled to at least one card consistent with any embodiment described herein. The frame 502 may include, for example, a power supply for providing power to each of the individual chassis 102A, 102B, 102C disposed in the frame 502, etc. Additionally, as mentioned above, the frame 502 may electrically couple one or more of the chassis 102A, 102B, 102C to at least one other chassis.

According to an alternative embodiment, rather than being disposed in a common frame, a system consistent with the present disclosure may include a plurality of chassis that may be individually hardwired to one another. One or more of the plurality of chassis may include at least one circuit board coupled to at least one card consistent with any embodiment described herein. Additionally, each of the plurality of chassis may be powered by an individual power supply and/or may be separately powered by a common power supply. Such a system may, therefore, provide a greater freedom in the physical arrangement and interrelation of the plurality of chassis.

Consistent with the foregoing, a first circuit board may be slidingly coupled to a second circuit board. The first circuit board may include a heat generating component disposed on a first side of the first circuit board. The heat generating component may be thermally coupled to the second side of the first circuit board, through the first circuit board. The second side of the first circuit board may be slidingly thermally coupled to a thermal solution associated with the second circuit board. In one embodiment, the first circuit board may be a module or a card, such as an advanced mezzanine card module, which may be hot-swappably coupled to a card carrier, such as an advanced telecommunications computing architecture blade. Slidingly coupling the card to the card carrier may also slidingly thermally couple the heat generating component of the card to a thermal solution associated with the blade.

In the foregoing embodiment, the heat generating component may be disposed on the first side of the advanced mezzanine card module may be thermally coupled to the second side of the advanced mezzanine card module via a through-board heat transfer device which may include a thermally conductive pathway extending at least partially though a circuit board of the advanced mezzanine card module. The heat transfer device may be thermally coupled to a thermal solution disposed on and/or associated with the advanced telecommunications computer architecture blade from the second side of the advanced mezzanine card module via a thermal interface device. The thermal interface device may be capable of providing a sliding thermal interface between a portion of the through-board heat transfer device on the second side of the advanced mezzanine card module and the thermal solution associated with the advanced telecommunications computing architecture blade.

Consistent with the present disclosure, heat may be dissipated from a heat generating component on a first circuit board through a thermal solution associated with a second circuit board. In the context of a mezzanine card or module slidingly coupled to a carrier, a heat generating component may be disposed in a limited airflow region, e.g., a heat generating component may be disposed on the mezzanine card and facing the carrier, and may dissipate heat through a thermal solution associated with the carrier. The heat generating component on the mezzanine card or module may be thermally coupled to the thermal solution associated with the carrier, at least in part, via conductive pathway though a board of the mezzanine card or module and via a sliding thermal interface between the conductive pathway and the thermal solution associated with the carrier. In addition to facilitating heat dissipation, the ability to dissipate heat though the board of the mezzanine module may allow taller heat generating components to be disposed between the mezzanine module board and the carrier, resulting from a decreased dependence upon the airflow between the mezzanine module and the carrier for cooling heat generating components. A configuration consistent with the present disclosure may also allow the use of higher heat generating components on a mezzanine module or card.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A system comprising:
   a chassis comprising a first circuit board comprising an advanced telecommunications computing architecture form factor, said first circuit board comprising a thermal solution;
   a second circuit board comprising at least one heat generating component disposed on a first side of said second circuit board,
   a thermally conductive pathway thermally coupled to said heat generating component, said thermally conductive pathway extending from said first side of said second circuit board to a second side of said second circuit board;
   a thermal interface device disposed on said second side of said circuit board and thermally coupled to said thermally conductive pathway capable of slidably thermally coupling to said thermal solution.

2. A system according to claim 1, wherein said second circuit board comprises an advanced mezzanine card module.

3. A system according to claim 1, wherein said thermal solution comprises a heat spreader.

4. A system according to claim 3, wherein said heat spreader comprises a component cover.

5. A system according to claim 1, wherein said thermally conductive pathway is coupled to said heat generating component via a heatsink thermally coupled to said heat generating component.

6. An apparatus comprising:
   a first circuit board comprising a thermal solution
   a second circuit board comprising at least one heat generating component disposed on a first side of said second circuit board,
   a thermally conductive pathway thermally coupled to said heat generating component, said thermally conductive pathway extending from said first side of said second circuit board to a second side of said second circuit board; and
   a thermal interface device disposed on said second side of said circuit board and thermally coupled to said thermally conductive pathway, said thermal interface device capable of slidingly thermally coupling to said thermal solution.

7. An apparatus according to claim 1, wherein said second circuit board comprises a hot-swappable card.

8. An apparatus according to claim 7, wherein said second circuit board comprises an advanced mezzanine card module.

9. An apparatus according to claim 6, wherein said thermal interface device comprises a thermally conductive member capable of slidingly contacting said thermal solution.

10. An apparatus according to claim 9, wherein said thermal interface device comprises a resilient element biased toward contact with said thermal solution.

11. An apparatus according to claim 9, wherein said thermal interface device comprises a first portion thermally coupled to said thermally conductive pathway and a second portion having an arcuate geometry capable of contacting said thermal solution.

12. An apparatus according to claim 6, wherein said thermal solution comprise a heat spreader.

13. An apparatus according to claim 12, wherein said heat spreader comprises a component cover.

14. An apparatus according to claim 6, wherein said thermally conductive pathway is coupled to said heat generating component via a heat generating component thermal solution.

15. An apparatus according to claim 6, wherein said thermally conductive pathway comprises a thermally conductive member extending through said second circuit board.

16. A method of dissipating heat comprising:
    providing a heat generating component disposed on a first side of a first circuit board
    transferring heat from said heat generating component through said first circuit board to a second side of said first circuit board;
    slidingly thermally coupling said second side of said first circuit board to a thermal solution disposed on a second circuit board.

17. A method according to claim 16, wherein transferring heat through said circuit board comprises providing a thermally conductive pathway extending between said first side of said circuit board and said second side of said circuit board.

18. A method according to claim 17, wherein said thermally conductive pathway is thermally coupled to said heat generating component.

19. A method according to claim 16, wherein slidingly thermally coupling said second side of said first circuit board to a thermal solution disposed on a second circuit board comprises providing a thermal interface device thermally coupled to said second side of said first circuit board and capable of sliding thermally coupling to said thermal solution.

20. A method according to claim 19, wherein said thermal interface device comprises a first portion thermally coupled to said second side of said first circuit board and a second portion having an arcuate geometry capable of slidingly contacting said thermal solution.

* * * * *